United States Patent [19]

Hallman et al.

[11] Patent Number: 4,472,494

[45] Date of Patent: Sep. 18, 1984

[54] BILAYER PHOTOSENSITIVE IMAGING ARTICLE

[75] Inventors: Robert W. Hallman, Poway; Eugene L. Langlais, San Diego; Ronald G. Bohannon, Santa Ana; Dominic B. Rubic, Oceanside, all of Calif.

[73] Assignee: Napp Systems (USA), Inc., San Marcos, Calif.

[21] Appl. No.: 395,289

[22] Filed: Jul. 6, 1982

Related U.S. Application Data

[63] Continuation of Ser. No. 187,623, Sep. 15, 1980, abandoned.

[51] Int. Cl.$^3$ .................. G03C 1/60; G03F 7/08; G03F 7/02
[52] U.S. Cl. .................. 430/160; 430/155; 430/166; 430/167; 430/175; 430/176; 430/271; 430/300; 430/325; 430/326; 430/533; 430/534; 430/535; 430/5; 430/293
[58] Field of Search .......... 430/160, 166, 167, 175, 430/176, 271, 533, 534, 535, 325, 326, 155, 300, 5, 293

[56] References Cited

U.S. PATENT DOCUMENTS

| | | |
|---|---|---|
| 2,365,416 | 12/1944 | Kuhne . |
| 2,709,655 | 5/1955 | Frederick . |
| 2,805,159 | 9/1957 | Unkauf . |
| 2,980,534 | 4/1961 | Printy et al. .................. 430/289 |
| 2,993,788 | 7/1961 | Straw et al. .................. 430/293 |
| 3,130,051 | 4/1964 | Herrick et al. .................. 430/302 |
| 3,136,636 | 6/1964 | Dowdall et al. . |
| 3,458,311 | 7/1969 | Alles .................. 430/300 |
| 3,549,373 | 12/1970 | Hamada et al. .................. 430/160 |
| 3,637,383 | 1/1972 | Hallman et al. . |
| 3,639,185 | 2/1972 | Colom et al. . |
| 3,721,557 | 3/1973 | Inoue .................. 430/166 |
| 4,008,084 | 2/1977 | Ikeda et al. . |
| 4,123,272 | 10/1978 | Quinn . |
| 4,124,395 | 11/1978 | Ochiai et al. .................. 430/534 |
| 4,126,466 | 11/1978 | Roos . |
| 4,173,673 | 11/1979 | Bratt et al. .................. 430/170 |
| 4,209,329 | 6/1980 | Lohner . |
| 4,217,407 | 8/1980 | Watanabe et al. .................. 430/166 |
| 4,229,517 | 10/1980 | Bratt et al. . |

FOREIGN PATENT DOCUMENTS

815956 7/1959 United Kingdom .
1525757 9/1978 United Kingdom .................. 430/160

OTHER PUBLICATIONS

Chemical Abstracts, vol. 56, #15075i, 1962, (W. Germany, 1,045,799—Ozalid Co.)

*Primary Examiner*—Charles L. Bowers, Jr.
*Attorney, Agent, or Firm*—Thomas G. Scavone

[57] ABSTRACT

Bilayer photosensitive imaging articles comprising a substrate coated with an image layer and a resist layer are disclosed. The substrate may be transparent, translucent or opaque to give imaging articles useful in different applications. The image layer which should be from about 0.3–3.0 microns in thickness includes an organic film-forming vehicle from the group of copolymers of the formula:

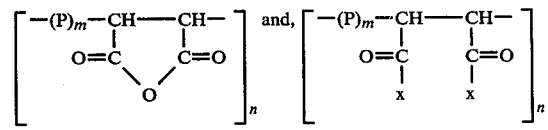

where P is styrene, ethylene or methyl vinyl ether; m is 1–3; n is 1,10; X is OH, OHN$_2$, ONH$_4$, OR, ONH$_3$R, ONH$_2$R$_2$, ONHR$_3$, ONH$_3$RNH$_2$, ONa, OK, OLi; R is an alkyl group in the range C$_1$–C$_{10}$ optionally including a functional group such as ketone, alcohol, esther, ether alcohol or aryl; m=1–3, n=1–10; and the molecular weight is between 1,000–150,000. The image layer may also include a coloring medium. The resist layer, which should be from about 0.5 to about 2.0 microns in thickness, comprises a material which, upon exposure to actinic radiation, changes solubility with respect to a developer in which the imager layer is also soluble. The resist layer may be negative-working or positive working.

In an important embodiment of the invention, the chemical composition and physical parameters of imaging articles particularly suited to the production of halftone images capable of subsequent etching are disclosed. These imaging articles exhibit unexpectedly excellent exposure and development latitude accompanied by outstanding etchability.

13 Claims, 6 Drawing Figures

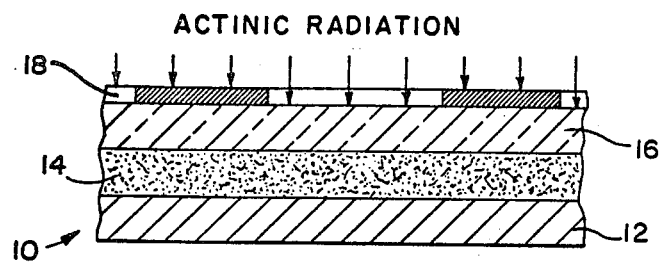
FIG-1-
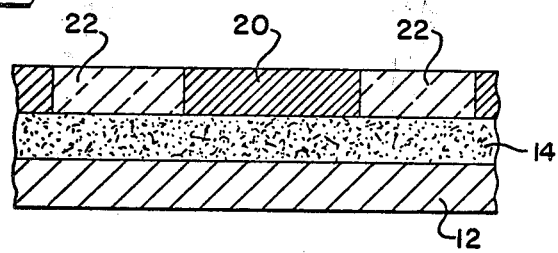
FIG-2-
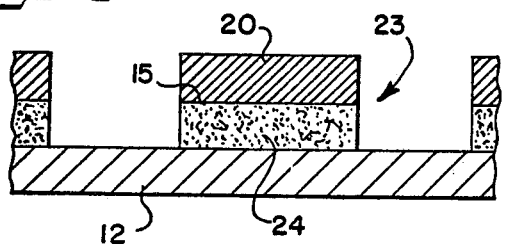
FIG-3-

BILAYER PHOTOSENSITIVE IMAGING ARTICLE

This application is a continuation, of application Ser. No. 187,623, filed Sept. 15, 1980, abandoned.

BACKGROUND OF THE INVENTION

The present invention relates generally to photosensitive imaging compositions and more specifically to bi-layer photosensitive imaging films.

Probably the most commonly used photosensitive imaging systems employ silver halide based compositions. Silver halide contact films, for example, have been widely used for many years and are still the standard of the industry. Similarly, a wide variety of silver halide color proofing films and contact papers are in common use. Even printed circuit resists generally rely on silver halide based photosensitive systems.

Silver halide photosensitive imaging compositions are inconvenient to store and to use. They must be stored in light-tight containers. Their shelf life is very limited. Furthermore, processing must be carried out in the dark or under subdued, safelight conditions. Development of silver halide based compositions is generally a multi-step process requiring separate development, fixing and washing procedures. The chemicals utilized in these procedures are also ecologically undesirable, being oftentimes toxic and difficult to dispose of. Furthermore, even after processing, the silver halide based images deteriorate quickly and are readily scratched and otherwise susceptible to surface damage.

Silver halide films pose further difficulties when attempting to produce halftone images. For example, the production of halftone images of uniform optical density is quite difficult, particularly in those applications where it is further necessary to reduce image surface area by etching image dots and holes.

Silver halide imaging compositions offer very limited etching latitude. When the silver halide image is subjected to an etching solution, the solution attacks the perimeter of the image (dots in highlight areas, holes in shadow areas) and the top surface of the image as well. Thus, the thickness of the image is reduced along with its perimeter resulting in an image of reduced optical density. Since significant reductions in optical density are generally unacceptable in many applications (e.g. color proofing), only very limited etching of silver halide halftone images is possible. Furthermore, similar problems arise in non-silver halide based images where the image surface is unprotected from the etching solution.

Although alternatives to silver halide photosensitive imaging compositions have been proposed and are now offered in the marketplace, these alternative materials have not significantly displaced the silver halide materials for a number of reasons. For example, these alternative materials suffer many of the same disadvantages found in the silver halide materials, including storage difficulties, short shelf life, safelight and multi-step development, and ecologically undesirable processing procedures. These alternative compositions are also susceptible to scratching and other damage, both before exposure and development and after. As a result, post-development protective overcoats are often necessary. Furthermore, unlike the silver halide compositions, these alternative compositions often require multi-step exposures. Finally, and perhaps most importantly, these alternative materials usually have very limited development and exposure latitude and produce images of inadequate optical density and definition.

SUMMARY OF THE INVENTION AND OBJECTS

The present invention is directed to a bilayer photosensitive imaging article which overcomes the various difficulties associated with prior photosensitive imaging compositions.

In its broadest sense, the present invention is directed to photosensitive imaging articles consisting of a substrate, an organic image layer disposed upon the substrate and an organic resist layer disposed upon the image layer. Important novel aspects of the present invention reside in the provision of specific layer components and thicknesses. Further important feature are attributable to the discovery of a method of halftone etching involving the production and etching of this bi-layer halftone image.

The photosensitive imaging articles of the present invention comprise a substrate bearing an image layer of from about 0.3 microns to about 3.0 microns in thickness. The image layer must be soluble in a given developer and generally consists of an organic film-forming vehicle.

The film-forming vehicle is preferably chosen from a particular group of styrene-maleic anhydride copolymers, which will be described in further detail below. Within this group of copolymers, a particularly important subgrouping is bimodal styrene-maleic anhydride copolymers, which will also be described in detail below.

The resist layer, which is disposed upon the image layer, should be from about 0.5 to about 2.0 microns in thickness. This layer consists of an organic-based material whose solubility with respect to the given developer is changed upon exposure of the resist layer to actinic electromagnetic radiation. Particular resist materials suitable in the practice of the present invention will be described below.

It is therefore an important object of the present invention to provide a bi-layer photosensitive imaging article which does not require special handling and may be stored and developed under daylight conditions.

It is a further object of the present invention to provide a photosensitive imaging article which may be readily processed with water or mildly alkaline developer solutions to produce durable images.

It is yet another object of the present invention to provide a photosensitive imaging article capable of producing images with outstanding definition and optical density which furthermore are durable, long lasting and reasonably resistant to scratching and other surface damage even without a protective overcoating.

A further object of the invention is to provide a photosensitive imaging article which does not require multiple step exposure or development.

An important object of the present invention is to provide a photosensitive imaging article capable of producing high quality halftone images that may be readily etched to varying degrees without significantly affecting image optical density.

Another important object of the present invention is to provide an improved method of etching a halftone image.

Other objects and features of the present invention will become apparent upon examination of the following specification and drawings, together with the claims. While the invention is described herein in connection with preferred or illustrative embodiments, these embodiments are not intended to be exhaustive or limiting of the invention. Rather, the present invention is intended to cover all alternatives, modifications and equivalents that may be included within its spirit and scope, as defined by the appended claims.

BRIEF DESCRIPTION OF THE DRAWINGS

FIG. 1 is a cross-sectional view illustrating the photosensitive imaging article of the present invention as conventionally exposed to electromagnetic actinic radiation through a halftone screen;

FIG. 2 is an illustration of the element of FIG. 1 after exposure through the halftone screen showing the formation of a latent image in the resist layer of the article;

FIG. 3 is an illustration of the article of FIG. 2 after removal of unexposed portions of the resist layer and corresponding portions of the image layer to leave a halftone highlight (dot) image on the substrate;

Similar reference numerals are applied to corresponding features throughout the different figures of the drawings.

DETAILED DESCRIPTION OF THE PREFERRED EMBODIMENTS

Figure 4:
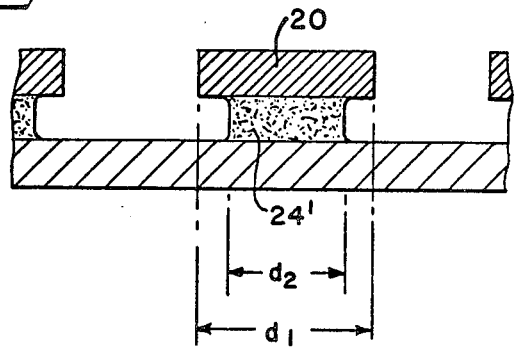
FIG. 4 is a representation, in section, of the halftone image of FIG. 3 after etching of the pigmented image layer.

With brief reference to the drawings, a photosensitive imagine article 10 is illustrated in FIG. 1 including a substrate 12, an image layer 14 containing a coloring medium and a resist layer 16. Above the resist layer 16 is a halftone screen 18 positioned for image-wise exposure of the article.

Substrates useful in the practice of the present invention may be clear, as in the case of clear plastic films or glass; they may be opaque, as in the case of papers or metal plates and foils; or they may be translucent, as in the case of matte films. Useful clear substrates include polyethylene, polyethylene terephthalate and polycarbonate films, such as thermoplastic polycarbonate condensation products of bisphenol-A and phosgene (Lexan). These clear films can be used to produce photosensitive imaging articles such as general purpose contact films and color proofing films. Useful opaque substrates include papers of various kinds such as filled polypropylene synthetic papers and polyethylene coated cellulose papers. Also tinted opaque substrates can be used to produce print papers, as well as negative and/or positive proofing papers. Since the present photosensitive imaging articles may be used to produce lithographic plates, useful lithographic substrates would also include metal plates and other rigid supports. Finally, useful translucent substrates include polyethylene and polyethylene terephthalate films which are matted during their manufacture or with subsequently applied coatings. The imaging articles produced with these substrates can be used as engineering drawing intermediates suitable for diazo-type white prints, sepias, and for other purposes which would be apparent to those skilled in the art.

The image layer used in the articles of the present invention should be of a composition soluble in a developer for the particular resist layer employed. Developers particularly useful in the practice of the present invention include water and mild aqueous alkaline solutions. These developers will be discussed further in connection with the resist layers and in the Examples set forth below.

Many of the important advantages inherent in the composition of the present invention are the result of careful control of the thicknesses of the image and resist layers.

Turning first to the image layer, it has been found that the thickness of this layer must be within the range of about 0.3 to about 3.0 microns. Thicker image layers result in slow and difficult development, as well as poor resolution. Image layers below about 0.3 microns in thickness generally lack the requisite film strength and adhesion, and cannot develop optical density for contact papers and color proofing films.

Within the specified thickness range for the image layer, it has been found that certain applications require yet further thickness limitations. Thus, for example, optimal color proofing films require image layers of from about 0.3 to about 1.0 micron in thickness. The produces optimal color intensity and purity, as well as outstanding resolution. General purpose contact films, on the other hand, should optimally have image layers in the broader thickness range of about 1.0 to about 3.0 microns.

As noted earlier, the image layer contains an organic film-forming vehicle soluble in the resist developer. Although a number of organic film-forming vehicles are known, certain styrene-maleic anhydride copolymers have been found to exhibit unexpectedly superior performance in the context of the present invention. Furthermore, these copolymers have been found to be readily tailorable to specific applications such as the production of photosensitive imaging articles suitable for halftone image formation and etching.

The styrene maleic anhydride (SMA) copolymers found to be particularly useful in the practice of the present invention include those having a molecular weight in the range of 1,000 to 150,000 and a formulation as follows:

1. SMA copolymers

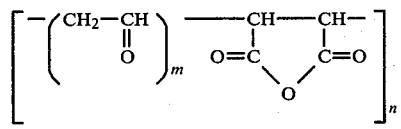

where m=1-3, n=1-10

2. Half esters and ammonium half amides of SMA copolymer

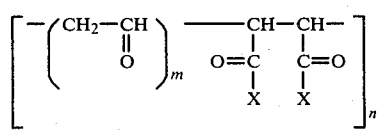

where X is OH, $ONH_2$, $ONH_4$, OR, $ONH_3R$, $ONH_2R_2$, $ONHR_3$, $ONH_3$, $RNH_2$, ONa, OK, OLi, R is an alkyl group in the range C1–C10 optionally including a functional group such as ketone, alcohol, ether, ether alcohol, or aryl and m=1-3, n=1-10.

Useful additives which may be blended with the identified SMA compositions include film-forming polymers also of molecular weight in the range 1,000-150,000:

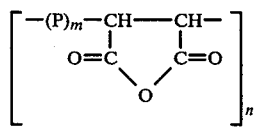   3.

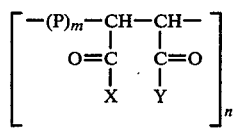   4.

where x, y, m, and n are as described in connection with the SMA formulas 1 and 2 above, P is ethylene or methylvinyl ether, and R is hydrogen, alkyl or aryl.

In some applications it may be desireable to tailor the characteristics of the above-described polymers. For example, recognizing that higher molecular weight polymers tend to be less soluble in aqueous developers, it may be necessary to introduce additives to improve image layer solubility. Low molecular weight polymers of the above-described structures may be used in such cases to improve solubility. For example, a SMA resin based on formula 1., where m=1-3, n=6-8 and molecular weight=1500-3000, as well as half esters and amine salts thereof are particularly useful in increasing image layer solubility. Other useful solubilizing agents would include generally linear ethylene maleic anhydride resins having a molecular weight between 8000 and 10,000, as well as their acid, single ammonium salt, double ammonium salt, half ester and diester forms. Another useful class would be poly(methylvinylether) maleic anhydride resins and their corresponding half ester forms, of molecular weight 5000-100,000. Yet another class of water-soluble materials useful in this connection would be glycols.

In addition to the above solubilizing agents, film modifiers may be added to the organic film-forming vehicle of the image layer. For example, compounds such as polyvinylacetate may be used to improve image layer flexibility and epoxy esters can be used to improve abrasion resistance.

The image layer 14 may be applied to the substrate 12 by any one of a number of conventional coating techniques well known to those skilled in the art. For example, both solvent and aqueous casting techniques may be employed, as well as conventional roller and gravure application procedures.

As those skilled in the art will recognize, adhesion can present a problem when applying a thin coating to a substrate as in the present invention. This problem may be overcome by selection of image layer and substrate materials which exhibit a greater degree of adhesive compatability. In other cases, as where polyethylene and polyethylene terephthalate films are used, it may be necessary to apply a subcoating to the substrate or to use specially pre-treated substrates. For example, where the image layer is aqueous cast, it may be particularly helpful to subcoat the substrate with a high molecular weight SMA copolymer (average molecular weight approximately 50,000) in methyl ethyl ketone. With solvent cast films, similar subcoating of high molecular weight SMA may also prove helpful. The use of this sublayer has a further unexpected advantage for both acqueous and solvent castings in that the resultant imaging article will produce clearer backgrounds due to the absence of pigment retention on (or staining of) the substrate. A less preferred alternative, would be to use pretreated films carrying an adhesive coating to improve image layer adhesion to the substrate.

In applications such as photosensitive imaging articles for use as lithographic plates, it is not necessary to introduce a coloring medium into the image layer. However, in a preferred embodiment of the present invention, the image layer will contain a coloring medium uniformly dispersed within the film-forming vehicle.

The coloring medium may be chosen from among the numerous commercially available pigments and dyes. The coloring medium may be used in an aqueous form, in a solvent-soluble form, or in the form of a dispersion. Where a particulate material is used, the particle size must be less than the image layer thickness. Preferably, the coloring medium particles will lie in the range of 100 to 5000 Angstroms. More preferably, the particles will lie in the range of 250 to 2500 Angstroms. Generally, smaller particle sizes will give better coverage, opacity, and film strength.

The quantity of coloring medium used should be sufficient to produce an optical density in the overall article of at least 3.0. On a weight basis, the ratio of coloring medium to film-forming vehicle should be in the range of 9:1 to 1:1 and preferably in the range of 2:1 to 1:1. The amount of pigment actually used will depend upon the intended application, since coloring medium to vehicle ratios affect many film characteristics such as adhesion, flexibility and development speed.

Although numerous pigments and dyes useful in the practice of the present invention will be apparent to those skilled in the art, a number of such useful materials are listed in Tables A and B below.

TABLE A

| Pigments |
| --- |
| Titanium Dioxide (rutile form) |
| Zinc Oxide |
| Iron Oxide (natural) |
| Chrome Oxide Green |
| Molybdate Orange |
| Ultra Marine Blue |
| Hansa Yellow G |
| Toluidine Red |
| Lithol Red |
| Lithol Rubine |
| Diarylide Yellow |
| Quinacridone Violet 19 |
| Phthalo cyanine Blue |
| Carbon Black |
| Raven 1000R |
| Regal 400R,300 |
| Elftex 8 |
| Special Schwarz 4A |
| Mogul A |
| Monarch 74 |
| Aqua Black Dispersion |
| Auresperse W7012 |

TABLE B

| Dyes |
| --- |
| Methyl violet |
| Rhodamine B |
| Fuchsine |

| TABLE B-continued |
|---|
| Dyes |
| Methylene Blue |
| Victoria Blue B |
| Malachite Green |
| Bismark Brown R |
| Alizarine Orange |

The resist layer 16 may be applied to the image layer again using conventional coating techniques. It is generally required that the thickness of this layer lie in the range of about 0.5 microns to about 2.0 microns, in order to obtain the outstanding exposure, development and resolution characteristics of the present photosensitive imagine articles. Resist layers of thickness below 0.5 micron are generally of insufficient resist strength and adhesion, and display poor scratch resistance. Excessively thick resist layers, on the other hand, result in poor resolution and poor shelf life. Furthermore, thick resist layers should be avoided because they require increased development time and are generally uneconomic.

The resist layer consists of a material whose solubility with respect to a given developer is changed upon exposure to actinic radiation. While a great variety of such materials are well known in the art, the outstanding advantages of the present invention may best be obtained with the resist materials described below.

One particularly suitable resist material is described in U.S. patent application Ser. No. 588,334, filed June 19, 1975 and abandoned in favor of continuation-in-part application Ser. No. 815,899, filed July 15, 1977 and now abandoned in favor of continuation application Ser. No. 051,652, filed June 25, 1979 and now abandoned, the disclosures of which are incorporated herein by reference. The resist material of these patent applications comprises a generally continuous phase and a generally discontinuous phase, with the continuous phase being a minor constituent of the overall structure. The continuous phase consists of a photosensitive materials whose solubility with respect to a developer is changed upon exposure to actinic radiation. The discontinuous phase which is a major constituent of the overall structure consists of a polymeric emulsion-dispersion made up of a particulate material which is substantially insoluble in the developer. The two phases are uniformly interdispersed throughout the entire resist layer 16.

The minor phase material of the above resist composition may be selected from the group consisting of diazo compounds, photopolymers, light sensitive dyestuffs, azo compound, and dichromates. The polymeric major phase material of the emulsion-dispersion of the resist film may be selected from the group consisting of polyacrylics, copolymers of acetate and ethylene, copolymers of styrene and acrylates, polyvinyl acetates and copolymers of vinyl acetate and acrylates.

Preferred compositions of the above described continuous phase-discontinuous phase resist layer may be formed from a polyvinyl acetate-acrylic polymer emulsion dispersion in water with paradiazo diphenylamine sulfate condensation product with paraformaldehyde (stabilized with zinc chloride). Preferred alternate discontinuous phase materials include polyacrylamide, polyvinyl acetate, polystyrene allyl alcohol and polyvinyl butyral.

Other photosensitive material useful as resist composition in the present invention include aqueous based diazo/colloid mixtures such as: paradiazo diphenylamine sulfate condensation product/hydroxy ethyl cellulose (Natrosol HHR 250 from Hercules) or paradiazo diphenylamine sulfate condensation product/polyacrylamide (high molecular weight).

Useful solvent based alternate resist materials would include mixtures of solvent soluble diazos and resins. Such diazos are typified by those listed in Table C. The resins useful in such cases are typified by those found in Table D. These tables, however, should not be considered restrictive.

A post-exposure treatment solution or developer particularly useful in connection with the above-described diazo materials is disclosed in U.S. patent application Ser. No. 875,367, filed Feb. 6, 1978, now abandoned in favor of U.S. patent application Ser. No. 051,478 filed June 25, 1979. The treatment solution described therein includes a water soluble desensitizing agent capable of reacting with residual photosensitive diazo to render it incapable of forming an oleophillic substance, and a filming agent selected from water soluble aliphatic polyols having less than eight carbon units, the acid derived monoesters of these polyo s, and the alkaline metal salts of the monoesters. The entire disclosure of the application Ser. No. 875,367, now abandoned is hereby incorporated by reference.

1. Sulfoesters of napthaquinone 1, 2 diazides such as:

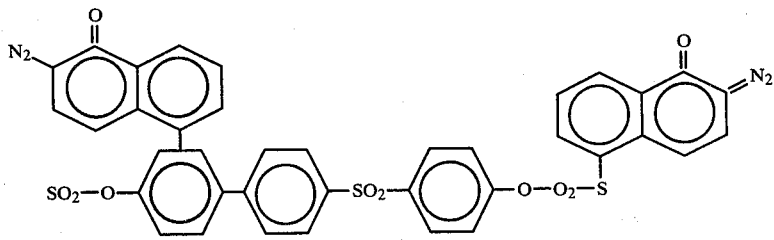

2. Sulfonamides of naphaquinone 1, 2 diazides such as:

-continued

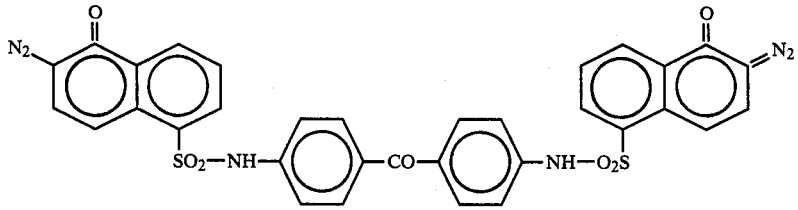

TABLE D

Phenolformaldehyde novalak
n-cresol formaldehyde novalak
Epoxy resin (epichlorohydrin-bisphenol A)
Poly vinyl acetate
Poly vinyl butyral
Ethyl acrylate-acrylic acid apolymer
Vinyl acetate-vinyl phthalate copolymer
Poly amide resins
Phenolic resins
Phenoxy resins
Epoxy ester resins
Polyimide resins
Vinylidene-acrylonitrile copolymer Once again, the photosensitive imaging articles of the present invention are formed by conventional methods. The image layer is first coated onto the substrate, optionally by successive passes, and followed by the resist layer which may be also applied by successive passes. The layers may be cast from solvents or from aqueous media, depending upon the choice of resist material and image layer film-forming vehicle. It is, of course, necessary, in most instances, that the image layer first be dried before the resist layer is applied and itself dried. Particular drying temperature requirements will depend upon the nature of formulations being used and will be apparent to those skilled in the art.

Exposure of the photosensitive imaging articles of the present invention will depend upon the thicknesses and composition of the resist and image layers. For color proofing films, for example, exposures of 10–30 seconds under a five kilowatt mercury vapor source (2800 micro-watt/cm$^2$) will produce satisfactory images. For lithographic films, 20–180 seconds under a similar source will suffice while 30–60 seconds are preferred.

As those skilled in the art would expect, development time is directly related to the thickness of the resist and image layers, as well as to the coloring medium to vehicle ratio, polymer molecular weight, polymer acid value, developer strength (e.g., concentration, pH, surface tension, ionic components) and thermal treatment history of the image layer. Generally development times will range from 15–120 seconds while 30–90 seconds are preferred. For positive working resists, where the positive working resist material is rendered soluble upon exposure, exposure time is, of course, a more significant factor in determining the development time.

Although photosensitive imaging articles generally following the above teaching are useful in producing halftone images, photosensitive imaging articles utilizing a particular subgrouping of organic film-forming vehicles exhibit unexpectedly outstanding performance in halftone applications.

Halftone images actually comprise an array of tiny dots in highlight areas and an array of tiny holes in shadow area. The halftone image is produced by exposing a photosensitive imaging article such as a proofing film to actinic radiation through a halftone screen as illustrated in FIG. 1. In this figure, the respective portion of the overall article or film 10 are the substrate 12, the pigmented image layer 14 and negative-working resist 16. After exposure, a latent image consisting of exposed portion 20 (which have been rendered insoluble to a given solvent) and unexposed portion 22 (whose solubility with respect to the same solvent has remained unaltered) is formed. Upon development, which is carried out by contacting and optionally rubbing the requisite developer over the surface of the film 10, the resist soluble portion 22 is removed along with corresponding soluble portion of the image layer 14. This leaves the structure depicted in FIG. 3, wherein dots 23 are shown in cross section. These dots have an optical density predetermined by the optical density of the image layer 14, which is in turn a function of layer thickness, the concentration and the nature of the coloring medium dispersed or dissolved therein, and the method of dispersion employed.

In color proofing and in other halftone applications, it is generally desirable and often required that the halftone images be etchable. The purpose of the etching process is to reduce the size or cross-sectional area of the dots in highlight areas and to increase the size of the holes in shadow areas to correct color and tone reproduction. It is most important in these applications that the optical density of the dots and the areas surrounding holes remain generally unaltered by the etching process.

As explained earlier, prior art films used as color separations cannot be etched without affecting dot/hole image optical density and possibly causing pinholing, because etching solutions attack both image surfaces as well as image perimeters. This shortcoming of prior art materials may be overcome to a very limited extent by using exposures that produce excessively thick dots, so percentagewise, loss of density upon etching is minimized. In this case, as well as in the general case where normal dots are produced, there is, however, always some danger of pinholing and some loss of optical density. When the optical density loss is excessive, the master is rendered useless, since actinic radiation can "burn through" areas of reduced density. Even without excessive density reduction, however, the change of optical density on the film limits film exposure latitude.

Figure 5:
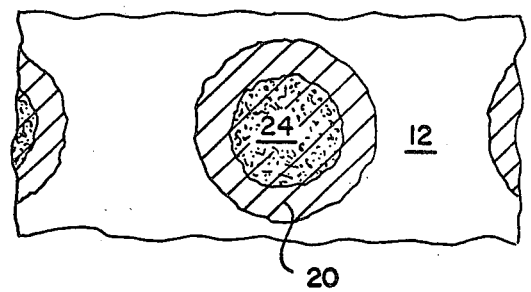
FIG. 5 is a top view of the etched article of FIG. 4.

In contrast with prior art halftone systems, the novel structure of the present invention will undergo, upon etching, a reduction in dot diameter and an increase in hole diameter without significantly affecting optical density. Thus, it is seen from FIGS. 3 and 4 that the dot resist portion will protect the surface 15 of the dot image layer 24 from the etching solution, and from scratching and other surface damage. When the dot image of FIG. 3 is subjected to further development or etching in the form of contact with a developer of generally equal or greater strength than that originally used, portions of the perimeters of the dot image layers 24 are removed decreasing the diameter from $d_1$ to $d_2$ without altering the thickness or density of that layer. The actual dot structure is illustrated in FIG. 4 wherein the resist dot portion 20 is unchanged but the dot image layer 24' is significantly reduced in cross section. A top view of the dot images of FIG. 4 appears in FIG. 5. In connection with the etched dot structure of FIG. 4, it should be further noted that the unsupported edges of the resist layer will tend to fall, thereby protecting the perimeter of the halftone images from damage due to abrasion and contact with foreign substances.

Figure 6:
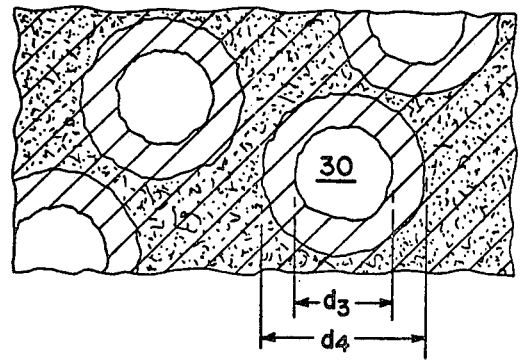
FIG. 6 is a top view similar to that of FIG. 5 showing an etched halftone shadow (hole) image produced with a photosensitive imaging article according to the present invention.

Likewise, FIG. 6 illustrates a shadow area of a halftone image, after exposure and etching, the holes 30 having been enlarged from diameter $d_3$ to diameter $d_4$ by the etching procedure while the resist layer remains unchanged by etching.

The present invention is directed to this method of halftone etching exclusive of the specific composition of the imaging article. This method entails the production of a halftone bilayer image on a substrate including a resist layer disposed on an image layer of uniform thickness and optical density. The resist layer should be insoluble in a given developer and the image layer should be soluble in that developer. Once the described halftone images are formed, the method then entails etching the images by treating them with the developer to selectively remove portions of the perimeters of the image layers without significantly altering the thickness or optical density of these image layers.

Returning to the photosensitive imaging article of the present invention, it must be understood that the provision of such an article having good exposure and development latitude accompanied by good dot etchability is completely unexpected. Good exposure and development latitude require that the image layer utilize a film-forming vehicle which is not overly soluble in the developer. An overly soluble image layer would have poor development latitude—background areas would be totally cleaned and highlight areas lost before shadow areas were adequately developed. In terms of the dot of FIG. 3, an overly soluble image layer would mean that even a slight increase in the optimal development time would result in unsatisfactory reproduction, possibly unduly reducing the size of the dot 23.

While good development latitude requires that image layer 14 not be overly soluble in the developer, good dot etchability requires just the opposite. That is, if dot image layer 24 is not sufficiently soluble in the developer, it will take unduly long to obtain the reduced dot image layer 24 of FIG. 4.

A particularly novel image layer composition has now been developed which overcomes the conflicting requirements of development latitude and dot etchability. The novel characteristics of this composition are obtained, in part, by the use of a group of bimodal copolymers and their derivatives as the film-forming vehicle. These bimodal copolymers consist of a combination of high molecular weight and low molecular weight polymer portions in a weight ratio of about 2:8 to about 8:2. The preferred weight ratio is 5:5.

The polymers useful in the bimodal compositions include all of the polymers described above in connection with the more general photosensitive imaging article. Most preferred among these copolymers is the earlier described SMA copolymers.

When SMA copolymers are utilized, the low molecular weight portion should desirably have a molecular weight of under about 5,000 and the high molecular weight portion should have a molecular weight exceeding 10,000. Preferred low molecular weights lie in the range of 1,000–2,000. Preferred high molecular weight potions lie in the range of 10,000–150,000 and most preferably in the range of 20,000–50,000. When the additional copolymers are utilized, their relative molecular weights will be in keeping with the SMA copolymer teaching.

Presently preferred and practical embodiments to the present invention are illustrated in the following examples wherein all parts are by weight, unless otherwise indicated.

EXAMPLE 1

A photosensitive imaging article useful as a general purpose contact film may be prepared in accordance with the teachings of the present invention as follows. A 4 mil polyester sheet is subcoated with a 10% solution of SMA of average molecular weight 50,000 in ethylene glycol monomethyl ether, and then dried. The subcoated polyester sheet is then coated with an image layer 1.5–2.3 microns in thickness of the formula:

50 grams SMA (average molecular weight 20,000),
40 grams Carbon black (Raven 1,000R),
400 grams N-butanol (as solvent).

The image layer is then top coated with a photodispersion following the teachings of the above referenced U.S. patent application Ser. No. 815,899, filed July 15, 1977:

50 grams Polyvinyl acetate—acrylic copolymer emulsion dispersion in water,
55 grams Water,
2 grams Paradiazo diphenylamine sulfate condensation product with para formaldehyde stabilized with zinc chloride (hereinafter diazo resin).

This final coating has a thickness of 0.7–1.5 microns and the overall product thus produced is again subjected to drying to provide a final bi-layer, general purpose contact film.

The above film is then exposed through an appropriate mask to ultraviolet radiation from a high intensity source such as a 5 kilowatt mercury halide lamp. The bi-layer film is then developed in an aqueous solution of a mild alkaline material such as $Na_2HPO_4$ with a pH of about 9.5–10.5. Light mechanical action will help to accelerate development. Development results in the removal of unexposed areas of the resist layer and corresponding portions of the image layer. After a suitable development time of from 15–60 seconds, a final product is obtained consisting of the exposed portions of the resist layer and corresponding portions of the image layer, both on the polyester sheet substrate. If the original mask was a negative mask, the resulting bi-layer film image will be a positive image. If the original mask was a positive mask, the resulting bi-layer image will be a negative image.

The image area of the bi-layer film made in accordance with this example will have an optical density in transmission of about 3.3–4.2. Since carbon black absorbs radiation in a wide range of wave lengths, this composition will be useful not only as a general purpose contact film, but also as a master for color proofing films, litho plates, and in circuit board manufacture. The resolution obtainable with this composition is at least 150 lines per inch.

EXAMPLE 2

A photosensitive imaging article utilizing an image layer with a bimodal organic film-forming vehicle may be produced as follows. The subcoated polyester substrate of Example 1 is coated with a pigment base layer having a thickness of 2.0 microns and the formula:
  60 grams Carbon Black,
  60 grams SMA (average molecular weight 20,000),
  30 grams SMA (average molecular weight 2,000),
  600 grams n-butanol, as solvent.

After this image layer is dried, a resist layer of 1.0 micron in thickness and the following formula is applied:
  50 grams Polyvinyl acetate-acrylic copolymer emulsion dispersion in water,
  4 grams Diazo resin,
  60 grams Water.

The bi-layer imaging article thus produced is exposed and developed as in Example 1. A negative master is used so that a positive print is obtained. Since exposure is carried out through a half tone screen, the image on the bi-layer film is made up of an array of dots in highlight areas and holes in shadow areas.

The color or tone of the halftone images may be adjusted by subjecting the bi-layer film to treatment with an alkaline etching solution like that used in development. A typical etching solution would be a Na2HPO4/Na3PO4 in water to produce a pH of about 11–12. This "dot etching" of the image is successful and produces the desired reduction in color and tone, without significantly affecting the optical density of the image dots and the portions of the image surrounding shadow holes.

EXAMPLE 3

The procedures of Examples 1 and 2 were followed to produce a series of six different bi-layer photosensitive imaging films with organic film-forming vehicles of varying ratios of high and low molecular weight polymer. These films were then tested to evaluate their development speed, development latitude and image etching speed. For present purposes, "development speed" means the time required to remove soluble portions of the resist and corresponding portions of the image layer to produce a satisfactory image on the film substrate. "Development latitude" refers to the range of development time which permits the bi-layer film to have background areas totally cleaned and shadow areas opened while still maintaining highlight areas of the film image. Finally, "image etching speed" refers to the minimum time required to obtain a 50% reduction in the surface area of highlight images (and a corresponding 30% increase in the area of the shadow images).

The various bi-layer films produced in this example and their respective properties are listed in the table below:

TABLE I

|  | A | B | C | D | E | F |
| --- | --- | --- | --- | --- | --- | --- |
| SMA (Molecular Weight 20,000) | 90 | 60 | 50 | 40 | 20 | 0 |
| SMA (Molecular Weight 2,000) | 0 | 30 | 40 | 50 | 80 | 90 |
| n-butanol | 600 | 600 | 600 | 600 | 600 | 600 |
| Carbon black (Raven 100R) | 60 | 60 | 60 | 60 | 60 | 60 |
| Development Speed (seconds) | 60 | 35 | 30 | 30 | 20 | 10 |
| Development latitude | 1.3X | 2.5X | 2.8X | 2.7X | 1.8X | 1.2X |
| Dot Etching speed (seconds) | 90 | 60 | 45 | 45 | 45 | 30 |

Examination of the above table will show that the compositions B, C and D display a combination of excellent development latitude and good dot etching speed. These examples utilize ratios of high molecular weight to low molecular weight polymer respectively of 60:30, 50:40 and 40:50. The results for composition E is less desirable though acceptable for some dot etching applications.

However, it is particularly interesting to examine compositions A and F which respectively utilize 100% of the high molecular weight polymer and 100% of the low molecular weight polymer. The composition A material has an extremely slow dot etching speed, making it ill suited to etching applications. The composition F material, on the other hand, has an extremely fast dot etching speed, but displays an undesirably narrow developing latitude. The extraordinary improvements in developing latitude and dot etching speed obtained in compositions B, C, D and E therefore represent an important, unexpected synergistic result.

EXAMPLE 4

Imaging articles are produced as set forth in Example 2, except the concentration of carbon black is varied from below 30 parts to over 90 parts.

Concentrations of carbon black within the range of 30 parts to 90 parts give good film structures. Below 30 parts, however, it is found that the thickness of the image layer must be increased greatly (e.g. from 1.5 microns to 4.0 microns) which produces an undesirable loss of resolution and development latitude. On the other hand, concentrations over about 90 parts increase film porosity resulting in overly rapid development, poor development latitude and a mechanically weak film. Furthermore, the increases over 90 parts carbon did not greatly improve the film optical density. The most preferred composition, based on development and dot etch speed, may be obtained with 60–79 parts carbon black.

EXAMPLE 5

Imaging articles for use as high optical density film masters are again produced as taught in Example 2 with the thickness of the image layer varied from 0.4–5.0 microns. Below about 1.0 micron the film obtained exhibits an undesirably low optical density, loss of mechanical strength and adhesion. On the other hand, films above about 3.0 microns in thickness exhibit significantly reduced resolution and density latitude. The most preferred balance of density latitude, resolution and development speed are obtained with films having image layers of from about 1.5 to about 2.5 microns in thickness.

EXAMPLE 6

The Example 2 structure was made with the exception that the high molecular weight SMA was replaced with a somewhat lower molecular weight species. The actual composition of the image layer was:
  70 grams SMA (molecular weight 10,000), 40 grams SMA (molecular weight 2,000),
60 grams Carbon black,
600 grams n-butanol.

The photosensitive imaging film obtained exhibited a faster development speed than that of Example 2 while maintaining acceptable development latitude and dot etching speed.

EXAMPLE 7

The effects of the molecular weights of the copolymers making up the film-forming vehicle of the image layer were evaluated in another two photosensitive imaging films prepared in accordance with the Example 2 teaching. These two films had image layers containing respectively:

1:
10 grams SMA (molecular weight 50,000),
40 grams SMA (molecular weight 10,000),
75 grams Carbon black,
650 grams n-butanol.

2:
25 grams SMA (molecular weight 50,000),
60 grams SMA (molecular weight 20,000),
65 grams Carbon black,
600 grams n-butanol.

Both of the above image layer compositions were found to produce useful films, in terms of mechanical strength. However, in both cases the dot etchability of the films was unsatisfactory for practical applications.

EXAMPLE 8

In this example, alternate polymers were substituted for the SMA of Examples 1 and 2. The particular formulas used to produce these image layers were the following:

1.
80 grams Poly(methyl, vinyl, ether/maleic, acid) isopropyl mono ester (Gantrez 335),
70 grams Carbon black (Regal 330R),
700 grams n-butanol.

2.
80 grams Poly(methyl, vinyl, ether/maleic acid) butyl mono ester (Gantrez 425),
70 grams Carbon black,
700 grams n-butanol.

3.
40 grams Poly(methyl, vinyl, ether/maleic acid) butyl mono ester,
50 grams SMA (molecular weight 10,000),
300 grams n-butanol,
400 grams Ethylene glycol monomethyl ether.

In cases 1 and 2, the resulting films' mechanical strength was generally unsatisfactory. In the case of formulation 3, however, far improved mechanical strength accompanied by other desirable film properties was obtained.

EXAMPLE 9

The teachings of Example 2 were followed, but alternate subcoatings of the following formulation were used:

1.
1 gram SMA (molecular weight 50,000),
9 grams Carboxylated polyvinyl acetate, (Nivac ASB 516—Air Products),
100 grams Ethylene glycol mono methyl ether.

2.
3 grams SMA (molecular weight 20,000),
7 grams Carboxylated polyvinyl acetate,
100 grams Methyl ethyl ketone,
9 grams SMA (molecular weight 50,000),
100 grams Methyl ethyl ketone.

All of the above subcoatings exhibited good adhesion between the polyester substrate and the image layer and produced a film with good stability and development latitude.

In another variation, the subcoating was eliminated entirely and a pretreated polyester material, such as Celanar 4500 series polyester was used. Once again, the results were good. In yet another variation, the subcoating was again eliminated but an untreated polycarbonate film was used. And again, satisfactory adhesion was obtained.

EXAMPLE 10

A series of formulations following the teaching of Example 2 were made with variations in the diazo resin of the resist layer. The resist layer formulations used in these alternative copositions were as follows:

1.
50 grams Polyvinyl acetate—acrylic copolymer emulsion dispersion in water,
6 grams Diazo resin,
100 grams Water.

2.
50 grams PVAC emulsion,
10 grams Diazo resin,
120 grams Water.

3.
50 grams PVAC emulsion,
15 grams Diazo resin,
130 grams Water.

4.
50 grams PVAC emulsion,
2 grams Diazo resin,
100 grams Water.

All of the above formulations were found to be workable. The major differences between the formulations related to exposure time requirements. Resist layers of thicknesses between about 0.75 and about 1.5 microns gave optimal results. In addition, introduction of surfactants such as P-toluene sulfonic acid or the addition of thickening agents such as polyvinyl alcohol, or gelatin made it possible to obtain workable thicknesses up to about 2.0 microns, however, shelf life and resolution problems begin to arise at a thickness of about 2.0 microns.

EXAMPLE 11

In this example, other water-soluble resins were added to the resist layer formulations top coated onto the structure of Example 2 to improve the performance of the overall imaging article. Among the formulations were the following resist layers:

1.
50 grams PVAC emulsion dispersion,
10 grams Diazo resin,
120 grams Water,
1 gram Hydroxy ethyl cellulose.

2.
50 grams PVAC emulsion dispersion,
10 grams Diazo resin,
120 grams Water,
2 grams Polyvinyl alcohol (Monsanto PVA 20–90).

3.
50 grams PVAC emulsion dispersion, 10 grams Diazo resin,
130 grams Water,
2 grams Gelatin.

4.
50 grams PVAC emulsion dispersion,
10 grams Diazo resin,
130 grams Water,
1 gram Water-soluble polyamide (K-resin from Unitika Ltd. of Japan).

Each of the final photosensitive imaging films produced with the above resist layers showed improved shelf life, improved optical properties and enhanced developability.

The addition of water-soluble or dispersible resins may therefore be desirable in some instances in order to modify and improve performance and coating properties.

EXAMPLE 12

Structures similar to those of Examples 1 and 2 were made with the use of the following solvent cast resist layers:

1.
10 grams Diazo resin BBP (a P-diazo diphenylamine sulfate condensate with paraformaldehyde stabilized with hexa fluorophosphate),
100 grams Dimethyl formamide.

2.
10 grams P-diazo diphenylamine sulfate condensate with paraformaldehyde stabilized with tetra fluorobrate (ZAL. BF4 from Sobin Chemicals),
100 grams Dimethyl formamide.

Both of these formulations produced films having superior shelf life and excellent resolution, especially in very thin films in the range of about 0.2 to about 0.6 microns.

Other organic solvents may be substituted for the dimethyl formamide without effecting the final characteristics of the film. For example, such solvents as dioxane, DM acetamide, ethylene glycol monomethyl ether and methyl ethyl ketone have been used satisfactorily.

EXAMPLE 13

Resins were added to the resist layers described in Example 12 to determine whether film characteristics could thereby be enhanced. The following formulations were evaluated:

1.
60 grams Diazo BBP,
30 grams SMA (molecular weight 20,000),
350 grams Dimethyl acetamide.

2.
50 grams Diazo BBP,
40 grams SMA (molecular weight 50,000),
20 grams SMA (molecular weight 2,000),
350 grams DMAC.

3.
55 grams Diazo ZAL.BF4,
35 grams Alkaline soluble polyvinyl acetate,
200 grams Dimethyl formamide,
150 grams n-butanol.

4.
50 grams Diazo ZAL.BF 4,
30 grams Polyvinyl butyral.

5.
114 grams Diazo BBP,
75 grams SMA (molecular weight 20,000),
21 grams Polyvinyl acetate,
78 grams SMA (molecular weight 2,000),
900 grams DMAC.

6.
100 grams Diazo BBP,
30 grams Polystyrene allyl alcohol,
20 grams Novalak 1280,
750 grams PMF.

7.
60 grams Diazo BBP,
30 grams Phenolic resin (Hercules Vinsol 790224-B),
300 grams PMF.

The results obtained in each case were good, the resin additions providing improved film formation and mechanical strength. Both alkaline soluble and non-alkaline soluble resins were useful, although alkaline soluble resins could be used in higher proportions. In fact, mixtures of alkaline soluble and non-soluble resins may, in certain instances, provide enhanced development latitude. In this connection, formulation 5 is a preferred embodiment.

In addition to the resins referred to in the above exemplary compositions, other useful resin additives are epoxies, phenoxies, acrylics, silicones, polyesters and polyamides.

EXAMPLE 14

The structures of Examples 1 and 2 were made by using a positive resist in place of the negative working resists described earlier. Use of a positive working resist will, of course, produce a negative image from a negative mask and a positive image from a positive mask.

The particular positive working resist coat used in this example was:
30 grams Quinone diazide (AZ 1350 J from Shipley),
40 grams Amyl acetate.

Development of the overall film bearing the above positive working resist was carried out in a developer consisting of:
75 ml AZ 606,
425 ml Water (overall pH 11.5-12.5).

Other useful developers for this resist would include the following compositions:

1.
4 grams KOH,
100 grams Water.

2.
10 grams $Na_2CO_3$,
2 grams $Na_3PO_4$,
100 grams Water.

3.
6 grams $Na_3PO_4$,
1 gram Sodium lauryl sulfate anionic surfactant,
100 grams Water.

EXAMPLE 15

Test work with differing coloring media was carried out in this example. The image layer composition of Example 13 was replaced with the following pigmented composition:

1.
80 grams SMA (molecular weight 20,000),
20 grams SMA (molecular weight 2,000),
80 grams Dinitraniline orange (pigment orange No. 5, 2-4 dinitroanalin coupled with beta naphthol),
400 grams Ethylene glycol mono methyl ether.

Next the positive working structure of Example 14 was modified by replacing the image layer with the following alternate image layer compositions:

2.
80 grams SMA (molecular weight 20,000),
20 grams SMA (molecular weight 2,000),
80 grams Dinitraniline orange (pigment orange No. 5, 2-4 dinitroanalin coupled with beta naphthol),
400 grams Ethylene glycol mono methyl ether.
3.
100 grams SMA (molecular weight 20,000),
90 grams $TiO_2$,
500 grams n-butanol.

Each of the above compositions produced a film with good ultraviolet absorbing characteristics. The white image produced with the film of composition 3 was of particular interest in duplicating negative masters. This film behaved like a negative but produced a positive image when viewed against a dark background. This unusual feature will be of particular usefulness to those practicing in the arts of proofing and stripping films.

EXAMPLE 16

A number of overlay color proofing films were made with image layers having the following exemplary compositions:
1.
29 grams Lithol rubine,
110 grams SMA (molecular weight 20,000),
850 grams Ethylene glycol monobutyl ether.
2.
80 grams Mogul carbon black,
100 grams SMA (molecular weight 10,000),
80 grams Ethylene glycol mono methyl ether.
3.
45 grams Phthalocyanine blue,
110 grams SMA (molecular weight 20,000),
1,000 grams n-butyl alcohol.
4.
38 grams Sun yellow AAA,
90 grams SMA (molecular weight 2,000),
850 grams Ethylene glycol mono methyl ether.

The above compositions were used in the structures of Examples 1, 2, 12, 13 and 14 to produce useful overlay color proofing films.

EXAMPLE 17

Image layer compositions following the teaching of Examples 1, 2, 12, 13, 14 and 16 could next be applied to white opaque substrates to produce negative and/or positive proofing or print papers. Suitable substrate materials would include filled polypropylene synthetic paper (e.g. Kimdura FPG 150, Melinex 990), and typical RC papers such as polyethylene coated cellulose papers. Further useful photosensitive imaging articles could be obtained by using the $TiO_2$ image layers suggested in Example 15 to coat paper pigmented black and overcoated with polyethylene.

Yet further useful photosensitive imaging articles could be produced by coating the structure of Example 14 onto translucent substrates. These articles would be useful as engineering drawing intermediates such as masters for diazo-type white prints and sepias. Suitable translucent substrates for this application would include: matte polyethylene terphthalate films, matte coated PET films (typically with $SiO_2$ in a resin binder as the matte coating) and matte finished polypropylene films.

EXAMPLE 18

While the image layers of the prior examples have been coated from solvent bases, aqueous base coating can also be accomplished within the teaching of the present invention. Such aqueous based coatings have a number of important advantages, since they are oftentimes more economical, less toxic and more acceptable environmentally. Typical useful aqueous base image layer formulations include the following:
1.
20 grams SMA (molecular weight 20,000; 10% solids solution in $NH_4OH$),
10 grams 28% $NH_3$,
170 grams Water,
0.01 grams Triton X-100 (nonionic surfactant),
70 grams Predispersed carbon black (i.e. Aquablack 135 from Bordon Chemical).
2.
15 grams SMA (molecular weight 20,000; 15% solution in $NH_3.H_2O$),
4 grams 28% $NH_4OH$,
80 grams $H_2O$,
40 grams Predispersed carbon black,
25 grams SMA (molecular weight 2,000; neutralized with $NH_4OH$).
3.
18 grams SMA (molecular weight 20,000; 15% solution in $NH_3.H_2O$),
108 grams SMA (molecular weight 10,000; 10% solution in $NH_3.H_2O$),
36 grams Predispersed carbon black.
4.
20 grams SMA (molecular weight 20,000; 15% solution in $NH_3.H_2O$),
80 grams SMA (molecular weight 10,000; 10% solution in $NH_3.H_2O$),
30 grams SMA (molecular weight 20,000; 10% solution in $NH_3.H_2O$),
1 gram Triton X-100 (nonionic surfactnat),
25 grams Predispersed carbon black.

The above image layers can be coated onto all of the substrates discussed earlier and may, as well, be overcoated with each of the resists of the above examples. It is also important to note that the development rate and development latitude of bimodal compositions 2, 3 and 4 is far superior to the results obtainable with image layers having 100% of either a high or low molecular weight styrene maleic anhydride. Dot etchability for these formulations is also exceptional.

EXAMPLE 19

As noted earlier, a particularly novel and useful feature of the present invention is that all of the photosensitive imaging articles produced in accordance with the present teaching can be developed with simple aqueous base developers. Organic solvents are not required. Furthermore, systems can be formulated such that all of the products can be developed with the same developer. Alternatively, the formulations can be optimized for each resist using slightly different developers for the different resists such as in the case of the positive resist.

This aqueous, tailorable feature of the present invention permits a hitherto unimaginable variety of graphic arts articles to be developed by the same chemistry and in the same type of processing equipment. The problems associated with prior full-line contact speed graphic arts products employing silver halides, photopolymer, diazo-type, diazo resin and other technologies to produce a variety of films, papers, proofs, intermediates and lithographic printing plates can be eliminated. With these prior systems, the user was confronted with a bewildering array of supplies and equipment associated with each of these different technologies and their differing development chemicals and processing equipment requirements. In sharp contrast to these prior systems, however, the photosensitive imaging article of the present invention may use a single type of exposure source, as well as a single development chemistry and one type of process equipment.

Typical general application developers useful with the present photosensitive imaging articles include:

1.
2% solution Sodium metasilicate,
1% solution Sodium lauryl sulfate.
2.
5 grams $Na_2HPO_4$,
2 grams $Na_3PO_4$,
100 grams Water.
3.
10 grams $Na_2CO_3$,
25 grams Sodium tripolyphosphate,
1 gram Sodium lauryl sulfate,
100 grams Water.
4.
3 grams KOH,
1 gram Triton X-100,
100 grams $H_2O$.
5.
5% solution Sodium lauryl sulfate,
5% solution Sodium sulfate,
1% solution Sodium xylene sulfonate,
1% solution $Na_3PO_4$.

A particularly useful developing solution for use with the photosensitive imaging articles of the present invention is disclosed in the aforementioned U.S. patent application Ser. No. 051,478, filed June 25, 1979. Typical useful formulations for this developer include:

6.
25 grams Potassium toluene sulfonate,
10 grams Disodium beta-glycero phosphate,
1 gram Triton X-100,
100 grams Water.
7.
30 grams Potassium toluene sulfonate,
5 grams Disodium beta-glycero phosphate,
5 grams $Na_2HPO_4$,
1 gram Triton 405,
100 grams Water.

In connection with the teaching of the application Ser. No. 051,478, it is noted that the developing solutions described therein use low molecular weight film formers such as sodium glycero phosphate. The basic requirements for these developers in the present application, however, do not necessitate such a restriction. Thus, high concentration (10–50%) of hydrotropic materials such as sodium xylene sulfonate, potassium toluene sulfonate, potassium cumene sulfonate and the like, in combination with alkaline salts in a weight concentration of from 1–15% may be used. Alkaline salts especially useful in this context are disodium phosphate, trisodium phosphate, sodium tripoly phosphate, tetrapotassium pyro phosphate, sodium hexametaphosphate, sodium glycerophosphate and the like. Other useful alkaline salts include sodium metasilicate, sodium orthosilicate, water glass and other complex sodium silicates, sodium citrate, potassium gluconate, sodium carbonate, ammonium metavanadate, potassium hydroxide, sodium acetate and the like. Of course, nonionic and anionic surfactants and combinations thereof may also be added as may film formers, thickeners, buffering agents, builders, defoamers and so on.

EXAMPLE 20

In addition to the film and paper substrate products of the prior examples, the photosensitive imaging articles which may be produced according to the teaching of the present invention include lithographic plates having as substrates the rigid materials commonly employed in that field. With lithographic plates, the developing formulations of Example 19 are particularly useful since they make possible one chemical, one step development and gumming. Of course, with lithographic printing plates, it is not necessary to use coloring media in the image layer although coloring media may optionally be introduced into the image layer in order to enhance visibility of the lithographic image.

One useful lithographic article may be made as follows. A grained silicated aluminum substrate is coated with both image and resist compositions comprising:

1.
Image layer:
60 grams Phthalocyanine blue,
210 grams SMA (molecular weight 20,000),
1,000 grams Ethylene glycol mono methyl ether.
Resist layer:
100 grams Diazo resin ZAL.BF4,
30 grams Epoxy resin (Araldite 7073 from, Ciba-Geigy),
30 grams Novalak 1280 (from Union Carbide),
800 grams Dimethyl formamide,
200 grams MEK.

Each layer is about 1 micron in thickness. Exposure is carried out with an ultraviolet radiation source through a negative mask. The lithographic plate thus produced is developed and gummed with composition 6 of Example 19. The resulting product is run on an offset press for several thousand copies which are all of acceptable definition and quality. Furthermore, these plates are resistant to the typical acidic fountain solutions used in printing operations. Uniquely, these plates are dot etchable; therefore, correctable after exposure.

Further lithographic plates are produced using the same grained silicated aluminum substrate with the following image layers and resist layers:

2.
Image layer:
100 grams SMA (molecular weight 50,000),
20 grams SMA (molecular weight 10,000).
Resist layer:
100 grams Diazo resin BBP,
10 grams Butvar B76 (from Monsanto),
50 grams Phenolic resin (Vinsol 790224-B), from Hercules),
2 grams Methylene blue dye.
3.
Image layer:
100 grams SMA (molecular weight 20,000),
20 grams SMA (molecular weight 2,000),
30 grams Dinitraniline orange.
Resist layer:
100 grams Diazo resin BBP,
50 grams Acrylic resin (DuPont 2044), 10 grams Styrene allyl alcohol resin, (Monsanto RJ101),
400 grams Dimethyl acetamide,
400 grams Ethylene glycol mono methyl ether.
4.
Image layer:
100 grams SMA (molecular weight 20,000),
900 grams n-butyl alcohol.
Resist layer:
80 grams Diazo resin ZAL.BF4,
20 grams SMA (molecular weight 50,000),
30 grams SMA (molecular weight 10,000),
20 grams Lithol rubine,
900 grams Dimethyl acetamide.

As in the case of formulation 1 of this example, each of the above formulations is exposed and developed by one of the developers of Example 19 to produce negative working plates. Naturally, the use of the positive working resist layers of Example 14 would give the positive analogue of these plates.

The spatial separation of the image coat from the photosensitive materials of the resist coat makes for the production of a more readily manufactured lithographic plate than would be the case with single layer plates. Furthermore, by making the bottom layer ultraviolet light absorptive, it is found that superb antihalation properties can be obtained which are not found in single layer plates.

EXAMPLE 21

This example illustrates the outstanding dot etchability characteristics of the present photosensitive imaging articles. A half-tone print is made following standard industry practices to produce a bi-layer image with an array of dots in highlight areas an an array of holes in shadow areas. A similar half-tone image is produced with a commercially available silver halide based film for comparison purposes.

The respective dots and holes of these images are examined under 200× magnification and then subjected to etching, using the teachings of the present invention to etch the bi-layer film and conventional etching techniques to etch the silver halide film.

Typical of the etch changes obtained with the bi-layer film were the following:

| Original Half-Tone Image Area (% of Entire Film) | Etched Image Area (% of Entire Film) | Percent Change |
|---|---|---|
| 90 (shadow) | 65 | 27 |
| 60 (mid-range) | 25 | 58 |
| 40 (mid-range) | 10 | 75 |
| 15 (highlight) | 5 | 67 |

Etching was accomplished in each of the above cases without a significant change in through-dot density. The original density prior to etching was about 3.6–3.8. Dot density remained in the 3.6–3.8 range after etching.

With the silver halide based films, however, it was found that an etching change of 10–20% in a mid-range, half-tone image (40–60% of surface area) was the maximum etch attain-without significant reduction in through-dot density. Highlight dots (5–20% of surface area) for silver based film were even less amenable to etching before unacceptable density losses occurred. Indeed, with the silver halide base films the density upon etching was found to be reduced from an original density of 4.5 to 2.6 or less. Such a density change, either locally or across the film, narrows the acceptable window for exposure and, indeed, may render the film useless as a mask to ultraviolet light.

Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

What we claim is:

1. A photosensitive imaging article comprising:
   a substrate;
   an organic image layer of from about 0.5 microns to about 3.0 microns in thickness disposed upon said substrate, said image layer being soluble in a developer and including film-forming polymeric resins comprising bimodal styrene-maleic anhydride copolymers and their half esters and ammonium half amides of molecular weights between 1,000–150,000 and including high molecular weight styrene-maleic anhydride copolymers and their half esters and ammonium half amides of at least 20% of weight of said polymeric resins and low molecular weight styrene-maleic anhydride copolymers and their half esters and ammonium half amides of at least 20% by weight of said polymeric resins, said high molecular weight copolymers having an average molecular weight in excess of about 10,000 and said low molecular weight copolymers having an average molecular weight below about 5,000; and
   a photosensitive resist layer of from about 0.5 microns to about 2.0 microns in thickness disposed upon said image layer, said resist layer being a material whose solubility with respect to said developer is changed upon exposure of said resist layer to actinic radiation.

2. A photosensitive imaging article comprising:
   a substrate;
   an organic image layer of from about 0.5 microns to about 3.0 microns in thickness disposed upon said substrate, said image layer being soluble in a developer and including film-forming polymeric resins comprising bimodal styrene-maleic anhydride copolymers and their half esters and ammonium half amides of molecular weights between 1,000–150,000 and including high molecular weight styrene-maleic anhydride copolymers and their half esters and ammonium half amides of at least 20% of weight of said polymeric resins and low molecular weight styrene-maleic anhydride copolymers and their half esters and ammonium half amides of at least 20% by weight of said polymeric resins, said high molecular weight copolymers having an average molecular weight in excess of about 10,000 and said low molecular weight copolymers having an average molecular weight below about 5,000; and
   a photosensitive resist layer of from about 0.5 microns to about 2.0 microns in thickness disposed upon said image layer, said resist layer being a material whose solubility with respect to said developer is changed upon exposure of said resist layer to actinic radiation and including a combination of photosensitive diazo compounds and polymeric resins.

3. The photosensitive imaging article of claim 2 wherein said image layer also includes a coloring medium.

4. The photosensitive imaging article of claim 2 wherein said resist layer comprises (a) diazo compounds chosen from the group consisting of quinone diazides and salts of aromatic diazonium compounds and (b) polymeric resins.

5. The photosensitive imaging article of claim 2 wherein said resist layer comprises a photosensitive film structure having a generally continuous phase and a generally discontinuous phase, said continuous phase being a minor constituent by weight of said structure and comprising a photosensitive material whose solubility with respect to a developer is changed upon exposure to actinic radiation, said discontinuous phase being a major constituent by weight of said structure and including a polymeric emulsion-dispersion comprising a particulate material which is substantially insoluble in said developer, said phases being uniformly dispersed throughout the entire film structure; and said minor phase material including diazo compounds chosen from the group consisting of quinone diazides and salts of aromatic diazonium compounds.

6. The photosensitive imaging article of claim 5 wherein said image layer also includes a coloring medium.

7. The photosensitive imaging article of claim 2 wherein said resist material is soluble in said developer prior to said exposure to actinic radiation, said resist material becoming insoluble therein upon said exposure, thereby rendering said photosensitive imaging article negative working.

8. The photosensitive imaging article of claim 2 wherein said resist material is insoluble in said developer prior to said exposure to actinic radiation, said resist material being soluble therein upon said exposure, thereby rendering said imaging article positive working.

9. A photosensitive imaging article comprising:
a substrate;
an organic image layer of from about 0.5 microns to about 3.0 microns in thickness disposed upon said substrate, said image layer being soluble in a developer and including film-forming polymeric resins comprising bimodal styrene-maleic anhydride copolymers and their half esters and ammonium half amides of molecular weights between 1,000–150,000 and including high molecular weight styrene-maleic anhydride copolymers and their half esters and ammonium half amides of at least 20% by weight of said polymeric resins and low molecular weight styrene-maleic anhydride copolymers and their half esters and ammonium half amides of at least 20% by weight of said polymeric resins, said high molecular weight copolymers having an average molecular weight in excess of about 10,000 and said low molecular weight copolymers having an average molecular weight below said 5,000; and
a photosensitive resist layer of from about 0.5 microns to about 2.0 microns in thickness disposed upon said image layer, said resist layer being a material whose solubility with respect to said developer is changed upon exposure of said resist layer to actinic radiation and including a combination of (a) photosensitive quinone diazides chosen from the group consisting of sulfo-esters, sulfo-amides, and salts of sulfonic acid of aromatic quinone diazides, and (b) polymeric resins.

10. A photosensitive imaging article comprising:
a substrate;
an organic image layer of from about 0.5 microns to about 3.0 microns in thickness disposed upon said substrate, said image layer being soluble in a developer and including film-forming polymeric resins comprising bimodal styrene-maleic anhydride copolymers and their half esters and ammonium half amides of molecular weights between 1,000–150,000 and including high molecular weight styrene-maleic anhydride copolymers and their half esters and ammonium half amides of at least 20% by weight of said polymeric resins and low molecular weight styrene-maleic anhydride copolymers and their half esters and ammonium half amides of at least 20% by weight of said polymeric resins, said high molecular weight copolymers having an average molecular weight in excess of about 10,000 and said low molecular weight copolymers having an average molecular weight below about 5,000; and
a photosensitive resist layer of from about 0.5 microns to about 2.0 microns in thickness disposed upon said image layer, said resist layer being a material whose solubility with respect to said developer is changed upon exposure of said resist layer to actinic radiation and including a combination of (a) photosensitive salts of aromatic diazonium compounds chosen from the group consisting of salts of amino and aryl amino benzene diazonium and reaction products thereof with carbonyl compounds, and (b) polymeric resins.

11. A photosensitive imaging article comprising:
a substrate;
an organic image layer of from about 0.5 microns to about 3.0 microns in thickness disposed upon said substrate, said image layer being soluble in a developer and including film-forming polymeric resins comprising bimodal styrene-maleic anhydride copolymers and their half esters and ammonium half amides of molecular weights between 1,000–150,000 and including high molecular weight styrene-maleic anhydride copolymers and their half esters and ammonium half amides of at least 20% of weight of said polymeric resins and low molecular weight styrene-maleic anhydride copolymers and their half esters and ammonium half amides of at least 20% by weight of said polymeric resins, said high molecular weight copolymers having an average molecular weight in excess of about 10,000 and said low molecular weight copolymers having an average molecular weight below about 5,000; and
a photosensitive resist layer of from about 0.5 microns to about 2.0 microns in thickness disposed upon said image layer, said resist layer comprising a photosensitive film structure having a generally continuous phase and a generally discontinuous phase, said continuous phase being a minor constituent by weight of said structure and comprising a photosensitive material whose solubility with respect to a developer is changed upon exposure to actinic radiation, said discontinuous phase being a major constituent by weight of said structure and including a polymeric emulsion-dispersion comprising a particulate material which is substantially insoluble in said developer, said phases being uniformly dispersed throughout the entire film structure; and said minor phase material including salts of condensation products of a carbonyl compound and 4-diazo-1,1'-diphenylamine.

12. The imaging article of claim 11 wherein said image layer also includes a coloring medium.

13. A photosensitive imaging article comprising:
a substrate;
an organic image layer of from about 0.5 microns to about 3.0 microns in thickness disposed upon said substrate, said image layer being soluble in a developer and including film-forming polymeric resins comprising bimodal styrene-maleic anhydride copolymers and their half esters and ammonium half amides of molecular weights between 1,000–150,000 and including high molecular weight styrene-maleic anhydride copolymers and their half esters and ammonium half amides of at least 20% of weight of said polymeric resins and low molecular weight styrene-maleic anhydride copolymers and their half esters and ammonium half amides of at least 20% by weight of said polymeric resins, said high molecular weight copolymers having an average molecular weight in excess of about 10,000 and said low molecular weight copolymers having an average molecular weight below about 5,000, said image layer also including about 10% to about 50% by weight carbon black as a coloring medium; and
a photosensitive resist layer of from about 0.5 microns to about 2.0 microns in thickness disposed upon said image layer, said resist layer being a material whose solubility with respect to said developer is changed upon exposure of said resist layer to actinic radiation and including a combination of photosensitive diazo compounds and polymeric resins.

* * * * *